United States Patent
Merz et al.

(10) Patent No.: US 9,713,851 B2
(45) Date of Patent: Jul. 25, 2017

(54) METHOD AND SYSTEM FOR ATTACHING FLEXIBLE CIRCUITS TO A MOUNTING SURFACE

(71) Applicant: Apple Inc., Cupertino, CA (US)

(72) Inventors: Nicholas G. Merz, San Francisco, CA (US); Shayan Malek, San Jose, CA (US); Sawyer I. Cohen, Sunnyvale, CA (US); Timothy Lui, Rialto, CA (US)

(73) Assignee: Apple Inc., Cupertino, CA (US)

( * ) Notice: Subject to any disclaimer, the term of this patent is extended or adjusted under 35 U.S.C. 154(b) by 116 days.

(21) Appl. No.: 14/078,412

(22) Filed: Nov. 12, 2013

(65) Prior Publication Data

US 2015/0062839 A1 Mar. 5, 2015

Related U.S. Application Data

(60) Provisional application No. 61/873,785, filed on Sep. 4, 2013.

(51) Int. Cl.
| | |
|---|---|
| *B23K 1/00* | (2006.01) |
| *B23K 26/22* | (2006.01) |
| *B23K 26/32* | (2014.01) |
| *B23K 26/323* | (2014.01) |
| *B23K 101/18* | (2006.01) |
| *B23K 101/42* | (2006.01) |

(Continued)

(52) U.S. Cl.
CPC ............ *B23K 1/0016* (2013.01); *B23K 26/22* (2013.01); *B23K 26/32* (2013.01); *B23K 26/323* (2015.10);

(Continued)

(58) Field of Classification Search
CPC .. B23K 1/0016; B23K 26/3233; B23K 26/22; B23K 26/3206; B23K 2201/42; B23K 2203/04; B23K 2201/18; B23K 2203/20; H05K 2201/10083; H05K 2201/10053; H05K 3/0061; H05K 1/189; H05K 2201/2009

(Continued)

(56) References Cited

U.S. PATENT DOCUMENTS

| | | | |
|---|---|---|---|
| 5,220,724 A | 6/1993 | Gerstner | |
| 6,077,090 A * | 6/2000 | Campbell | H01R 12/7082 439/67 |

(Continued)

FOREIGN PATENT DOCUMENTS

| | | |
|---|---|---|
| WO | WO2008105744 | 9/2008 |
| WO | WO2013032670 | 3/2013 |

OTHER PUBLICATIONS

Allyson Kazmucha, "How to fix a stuck or broken On/Off button on a GSM/AT&T iPhone 4", dated Jul. 21, 2012.

*Primary Examiner* — Tuan T Dinh
*Assistant Examiner* — Rockshana Chowdhury
(74) *Attorney, Agent, or Firm* — Downey Brand LLP (57) ABSTRACT

A method and system for securing a flexible circuit to a mounting structure is disclosed. The system can include a surface-mount device, flexible circuit, stiffener, and bracket. The stiffener is used as an intermediate coupling device between the flexible circuit and bracket. The flexible circuit is coupled to the stiffener with a heat-activated adhesive. Next, the surface-mount device is mounted to the flexible circuit with surface-mounting techniques. A peripheral area of the stiffener is then welded to the bracket. The bracket in turn can be fastened to the enclosure of an electronic device.

16 Claims, 7 Drawing Sheets

(51) Int. Cl.
 B23K 103/04 (2006.01)
 B23K 103/20 (2006.01)
 H05K 1/18 (2006.01)
 H05K 3/00 (2006.01)
 B23K 103/00 (2006.01)

(52) U.S. Cl.
 CPC ...... *B23K 2201/18* (2013.01); *B23K 2201/42* (2013.01); *B23K 2203/04* (2013.01); *B23K 2203/05* (2015.10); *B23K 2203/20* (2013.01); *B23K 2203/50* (2015.10); *H05K 1/189* (2013.01); *H05K 3/0061* (2013.01); *H05K 2201/10053* (2013.01); *H05K 2201/10083* (2013.01); *H05K 2201/2009* (2013.01)

(58) Field of Classification Search
 USPC .......................................................... 361/749
 See application file for complete search history.

(56) References Cited

U.S. PATENT DOCUMENTS

| | | | | |
|---|---|---|---|---|
| 7,714,931 B2* | 5/2010 | Singh | ............... | H01L 27/14618 348/374 |
| 8,253,051 B2* | 8/2012 | Dai | ........................ | H01H 13/52 200/344 |
| 8,283,587 B2* | 10/2012 | Ouyang | ............. | H01H 13/7073 200/345 |
| 2002/0130985 A1* | 9/2002 | Weindorf | ............. | G02B 6/0068 349/61 |
| 2005/0280139 A1* | 12/2005 | Zhao | ....................... | H01L 23/24 257/704 |
| 2005/0285973 A1* | 12/2005 | Singh | ................ | H01L 27/14618 348/374 |
| 2008/0218975 A1* | 9/2008 | Mitsui | ................. | H01L 23/4006 361/709 |
| 2009/0290619 A1* | 11/2009 | Flens | ....................... | G02B 6/43 375/219 |
| 2010/0061055 A1* | 3/2010 | Dabov | .................. | G06F 1/1626 361/679.56 |
| 2010/0090847 A1* | 4/2010 | Hendren | ............... | G06F 1/1616 340/636.1 |
| 2011/0255260 A1* | 10/2011 | Weber | .................. | H04M 1/026 361/807 |
| 2011/0255850 A1* | 10/2011 | Dinh | ....................... | G03B 15/03 396/176 |
| 2013/0032681 A1* | 2/2013 | Balk | ......................... | F16L 3/13 248/235 |
| 2013/0050912 A1* | 2/2013 | Jarvis | .................... | G06F 1/1626 361/679.01 |

\* cited by examiner

METHOD AND SYSTEM FOR ATTACHING FLEXIBLE CIRCUITS TO A MOUNTING SURFACE

CROSS-REFERENCE TO OTHER APPLICATIONS

This application claims the benefit under 35 U.S.C. 119(e) of U.S. Provisional Application No. 61/873,785 entitled "METHOD AND SYSTEM FOR ATTACHING FLEXIBLE CIRCUITS TO BRACKETS" filed on Sep. 4, 2013, which is incorporated herein by reference in its entirety for all purposes.

FIELD OF THE DESCRIBED EMBODIMENTS

The described embodiments relate generally to securing flexible electronics within an electronic device. In particular methods and systems for securing a flexible circuit to a bracket or to a portion of a device enclosure are described.

BACKGROUND

Flexible circuits can be secured to various components within an electronic device using pressure sensitive adhesive. The strength of pressure sensitive adhesive is proportional to the surface area over which the adhesive is applied. As portable electronic devices become smaller, the components used in these devices also become smaller. Consequently, the surface area available for pressure sensitive adhesive is limited and in many cases may not be large enough to adequately secure the flexible circuit.

Therefore, what is desired is a reliable way to secure flexible circuits within an electronic device.

SUMMARY OF THE DESCRIBED EMBODIMENTS

This paper describes various embodiments that relate to securing flexible electronics within a device enclosure.

In a first embodiment a method for securing a flexible circuit to a mounting structure within an electronic device is disclosed. The method includes at least the following steps: coupling a securing element to a first surface of the flexible circuit using a heat-activated adhesive; soldering a surface-mount device to a second surface of the flexible circuit; and laser welding a portion of the securing element to the mounting structure. The laser welding operation is conducted at a distance from the surface-mount device such that the solder used to attach the surface-mount device to the second surface of the flexible circuit is not reflowed during the laser welding operation. It should be noted that the second surface of the flexible circuit is opposite the first surface of the flexible circuit.

In another embodiment, a securing assembly is disclosed. The securing assembly is suitable for securing a flexible circuit to a mounting surface. The mounting surface can be within an inside surface of a device enclosure. The securing assembly includes a flexible circuit, a securing element, a surface-mounted device, and a bracket. The flexible circuit can have a first and second surface, the first surface being opposite the second surface. The surface-mount device is soldered to the first surface of the flexible circuit and the securing element is coupled to the second surface of the flexible circuit by a heat-activated adhesive. Furthermore, the securing element is welded to the bracket. The bracket is configured to be coupled to the mounting surface.

In another embodiment, an electronic device is disclosed. The electronic device includes an enclosure having an inside surface, a securing assembly, and one or more surface mount devices. A portion of the inside surface can be detachably coupled to the securing assembly. The securing assembly includes a flexible circuit, a securing element, and a mounting structure. The flexible circuit can have a first surface and a second surface; the first surface opposite the second surface. A surface mount device can be soldered to second surface while the securing element can be coupled to the first surface by a heat-activated adhesive. The securing element can also be welded to the mounting structure. In one aspect of the embodiment the inside surface, mounting structure, and securing element can each an opening, the openings can correspond and can be configured to receive a fastener.

Other aspects and advantages of the invention will become apparent from the following detailed description taken in conjunction with the accompanying drawings which illustrate, by way of example, the principles of the described embodiments.

BRIEF DESCRIPTION OF THE DRAWINGS

The described embodiments may be better understood by reference to the following description and the accompanying drawings. Additionally, advantages of the described embodiments may be better understood by reference to the following description and accompanying drawings. These drawings do not limit any changes in form and detail that may be made to the described embodiments. Any such changes do not depart from the spirit and scope of the described embodiments.

DETAILED DESCRIPTION OF SELECTED EMBODIMENTS

Representative applications of methods and apparatus according to the present application are described in this section. These examples are being provided solely to add context and aid in the understanding of the described embodiments. It will thus be apparent to one skilled in the art that the described embodiments may be practiced without some or all of these specific details. In other instances, well known process steps have not been described in detail in order to avoid unnecessarily obscuring the described embodiments. Other applications are possible, such that the following examples should not be taken as limiting.

In the following detailed description, references are made to the accompanying drawings, which form a part of the description and in which are shown, by way of illustration, specific embodiments in accordance with the described embodiments. Although these embodiments are described in sufficient detail to enable one skilled in the art to practice the described embodiments, it is understood that these examples are not limiting; such that other embodiments may be used, and changes may be made without departing from the spirit and scope of the described embodiments.

Flexible electronics, also commonly known as flexible circuits, are generally embodied as flexible plastic substrates upon which conductive traces are printed. In some embodiments a flexible circuit can be single layer while in other embodiments a multi-layer flexible circuit can be constructed. In other embodiments a flexible circuit can be configured to allow access to conductive traces and other features from both sides of the flexible circuit. For example, either side of the flexible circuit can be grounded to a conductive surface to which it is attached. Because of their ability to conform to a desired shape or flex during use, flexible circuits can be suitable for routing signals between components disposed within a small electrical device. In some embodiments, an electronic component can be surface-mounted directly onto a surface of a flexible circuit. Surface mountable electronic components are often referred to as surface-mount devices (SMD).

Flexible circuits can be supported and/or mounted to a portion of the electronic device using an adhesive. For example a pressure sensitive adhesive can be applied between a surface area of the flexible circuit and a mounting surface within the electronic device configured to receive the flexible circuit. The mounting surface can be a portion of the electronic device's enclosure or can be a portion of a mounting structure that is configured to be detachably coupled to the electronic device's enclosure. The corresponding surface areas can then be pressed against each other to activate the pressure sensitive adhesive. Unfortunately, in certain embodiments, components designed for use in a small enclosure frequently do not have sufficient surface area to maintain a robust adhesive coupling between a mounting surface and a flexible circuit. This can be of particular concern when the adhesive coupling is frequently subjected to normal and/or shear force components as a part of normal operation of a device. For example, a flexible circuit adhesively coupled to a slide switch can undergo significant sheering force during actuation of the slide switch and would consequently benefit from a robust adhesive connection. One solution is to use an adhesive with stronger adhesion per unit area. Many heat-activated adhesives have higher holding forces than pressure sensitive adhesives; however, in some cases, using a heat-activated adhesive to attach a flexible circuit directly to the device enclosure can require too much heat and can cause adverse effects to the flexible circuit and/or SMD. For example, during a heat activated adhesion process solder disposed between an SMD and a flexible circuit can undergo reflow. As the solder reflow between the components is not controlled in such an eventuality, this occurrence can degrade or in some cases sever any electrical coupling that had been formed by the reflowed solder.

In one embodiment, this problem can be overcome by securing the flexible circuit to a mounting structure, such as a bracket, using a securing element. That is, the securing element can be used as an intermediate coupling device for securing the flexible circuit to the bracket. In turn, the bracket can be coupled with the device enclosure. Although embodiments throughout this disclosure can describe a mounting structure taking the form of a bracket, it should be understood that this embodiment is not limiting and that mounting structure can be any structure suitable for supporting/mounting a flexible circuit, including the device enclosure.

In one aspect of the embodiment, a portion of the securing element is bound to the flexible circuit with a heat-activated adhesive. Subsequently, a portion of the securing element is welded to the bracket. Accordingly, the securing element is made of material suitable for both welding and surface adhesion. Generally, the heat required in a welding operation is proportional to the size of the items welded. Accordingly, reducing the size of one or both of the items to be welded will reduce the heat required in the welding operation. Therefore, to reduce the heat required to weld the securing element to the bracket, the securing element can be smaller than the bracket. For example, the securing element can have less surface area, volume and/or thickness than the bracket. Because the securing element can be used for both welding and surface adhesion, the aforementioned methods and techniques result in a stronger coupling for connecting the flexible circuit with the bracket.

In one aspect of the embodiment, the securing element is laminated to one side of the flexible circuit using a heat-activated adhesive. The heat-activated adhesive can be a thin layer of film. Relatively, less surface area is required because heat-activated adhesive has a greater strength of adhesion per surface area than pressure-sensitive adhesive. Additionally, a heat-activated adhesive can be less susceptible to heat than pressure sensitive adhesives. Accordingly, a heat-activated adhesive can be less susceptible to adverse effects from heat emitted during subsequent steps in an assembly process, such as a welding operation, than a pressure sensitive adhesive. Furthermore, an adhesive coupling can also be less susceptible to delamination due to normal heat excursions from normal operation of proximate electrical components. An electronic component, such as an SMD, can then be mounted to the other side of the flexible circuit. In yet another aspect of the embodiment, the SMD can be mounted to a surface of the flexible circuit using surface-mount technology (SMT). After the SMT mounting of the SMD is complete, a portion of the securing element can be welded to the bracket, thereby securing the flexible circuit and SMD with the bracket.

These and other embodiments are discussed below with reference to FIGS. 1-7; however, those skilled in the art will readily appreciate that the detailed description given herein with respect to these figures is for explanatory purposes only and should not be construed as limiting.

Figure 1:
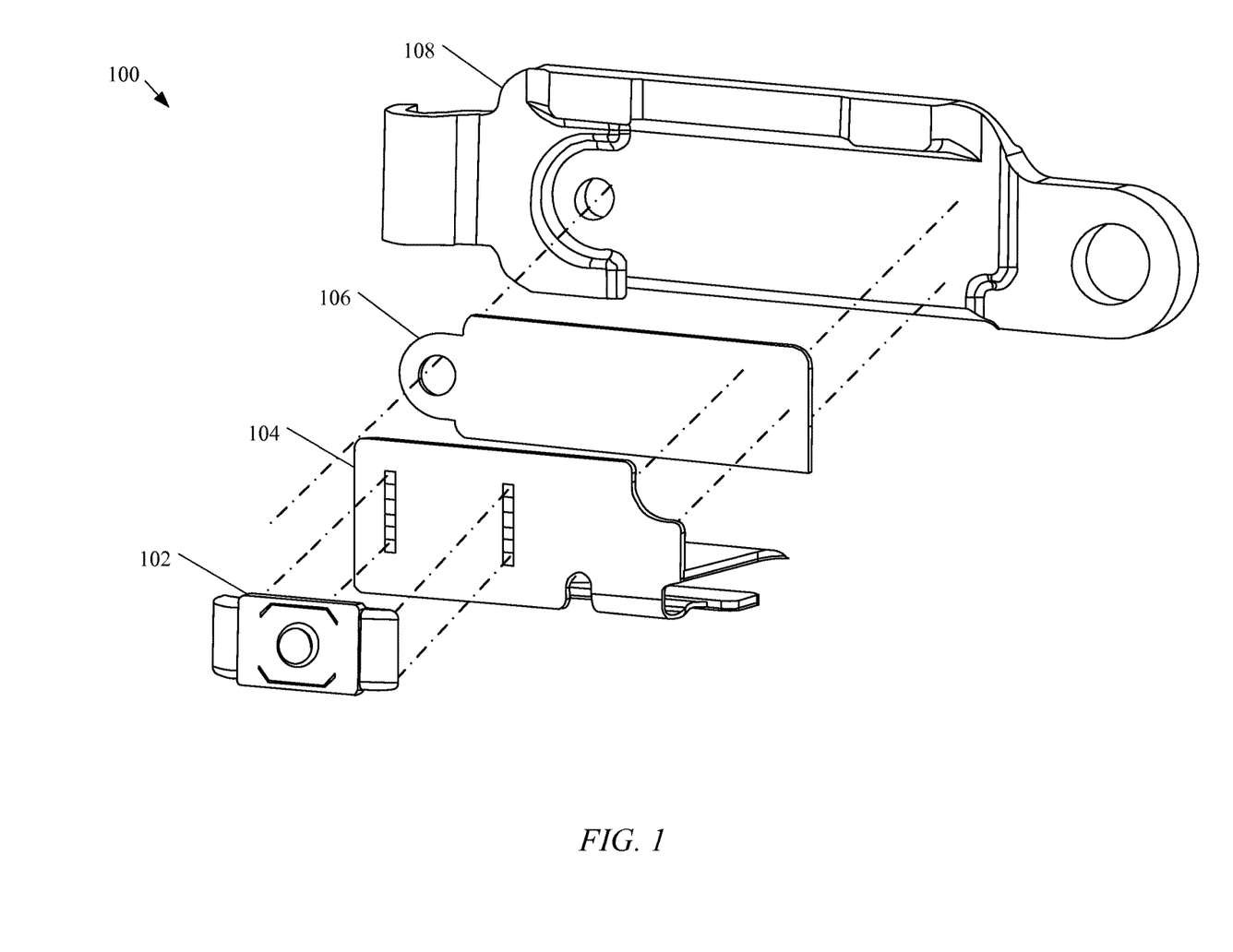
FIG. 1 shows an exploded view of a securing system in accordance with the described embodiments.

FIG. 1 shows an exploded view of securing system 100 according to one embodiment. Securing system 100 includes SMD 102, flexible circuit 104, securing element 106, and bracket 108. Securing system 100 can be used to secure SMD 102 to a device enclosure. SMD 102 can be any device suitable to be mounted on flexible circuit 104. For example, SMD 102 can be a switch, microphone, connector, etc. In one aspect of the embodiment, SMD 102 can have one or more metal contacts (i.e. terminals) that can be directly soldered to a surface of flexible circuit 104. For example, SMD 102 can be packaged in a dual-in-line configuration or a ball grid array configuration for soldering SMD 102 directly to solders pads on flexible circuit 104.

Flexible circuit 104 can be a substantially planar substrate configured to support and electrically couple various electrical components. At least one side of flexible circuit 104 can be configured to be coupled with SMD 102. In one aspect of the embodiment, SMD 102 is mounted on one side of flexible circuit 104 while securing element 106 is coupled to an opposing side of flexible circuit 104. Flexible circuit 104 can electrically couple SMD 102 to a processor (not shown) of an electronic device. Securing element 106 can take the form a structure suitable for surface adhesion and welding such as a stiffener. Although the following embodiments will describe securing element 106 taking the form of a stiffener from here on out, it should be understood that this embodiment is not limiting and that securing element 106 can take many other forms.

Securing element 106 can be configured to have less surface area, volume and/or thickness than bracket 108. In one embodiment, securing element 106 is about 0.10 mm thick. Bracket 108 includes a surface area for coupling at least a portion of securing element 106 to bracket 108. In one aspect of the embodiment, bracket 108 is welded to a portion of securing element 106. Accordingly, at least a portion of bracket 108 is made of weldable material. For example, bracket 108 can be made of steel or aluminum. Bracket 108 can also be coupled to stiffener 106 using a fastener. For example, a fastener can be passed through an opening in securing element 106 and a corresponding opening in bracket 108 and driven into an opening in a device housing configured to receive the fastener until the bracket 108 and securing element 106 are mechanically coupled with the housing. Furthermore, bracket 108 is configured to be removably coupled to a device enclosure or device housing.

Securing element 106 can be configured to have less surface area, volume and/or thickness than bracket 108. In one embodiment, securing element 106 is about 0.10 mm thick. Bracket 108 includes a surface area for coupling at least a portion of securing element 106 to bracket 108. In one aspect of the embodiment, bracket 108 is welded to a portion of securing element 106. Accordingly, at least a portion of bracket 108 is made of weldable material. For example, bracket 108 can be made of steel or aluminum. Bracket 108 can also be coupled to stiffener 106 using a fastener. For example, a fastener can be passed through an opening in securing element 106 and a corresponding opening in bracket 108 and driven into an opening in a device housing configured to receive the fastener until the bracket 108 and securing element 106 are mechanically coupled with the housing. Furthermore, bracket 108 is configured to be removably coupled to a device enclosure or device housing.

Figure 2:
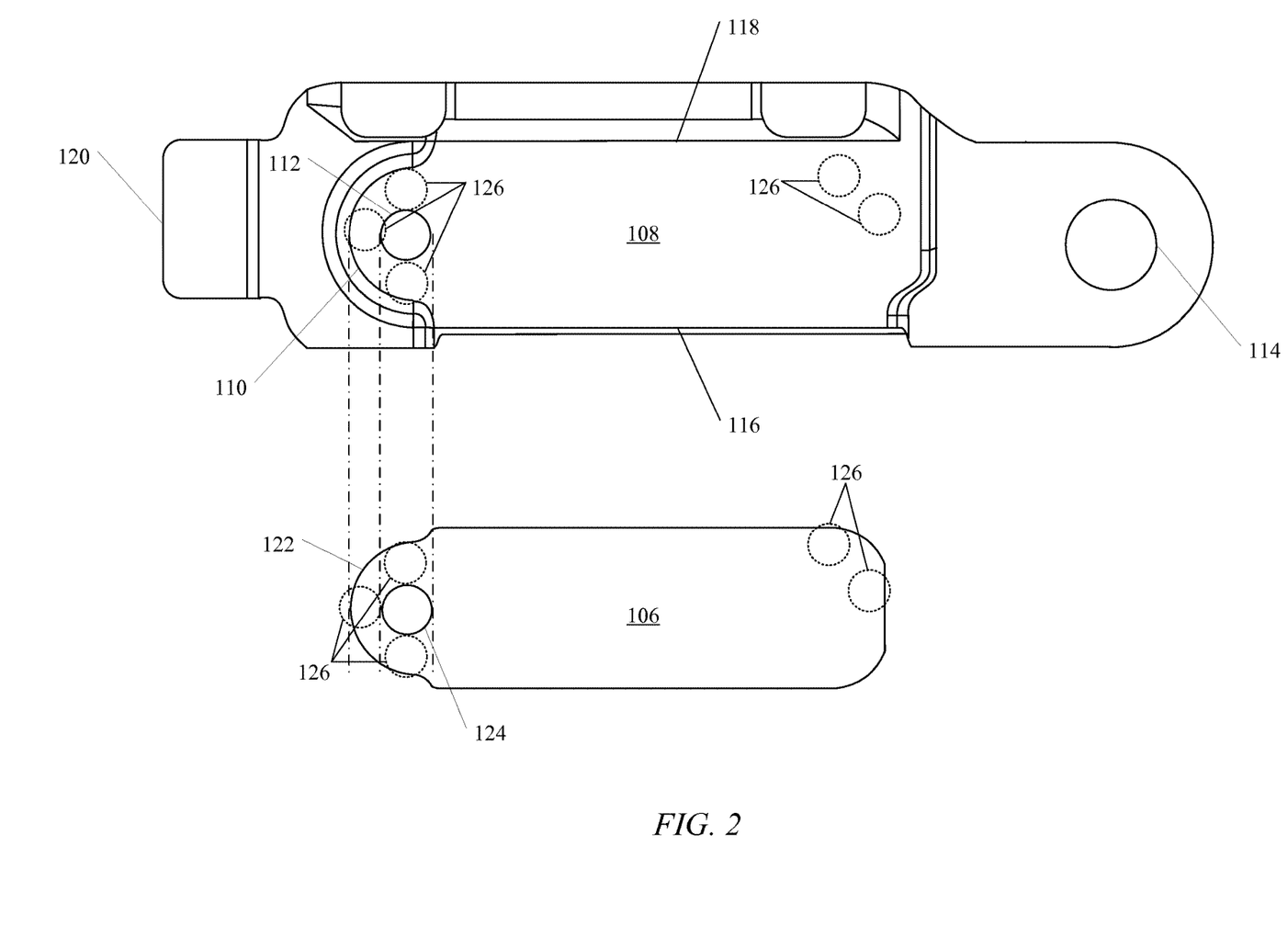
FIG. 2 shows a bracket and a stiffener.

FIG. 2 shows bracket 108 and securing element 106 according to one embodiment. Bracket 108 can include alignment feature 110, opening 112, opening 114, planar portion 116, indentation 118, and hook 120. Bracket 108 is configured to be removably attached to a portion of a device enclosure. For example, openings 112 and 114 can be part of a fastening system for fastening bracket 108 to a device enclosure. During an assembly process, openings 112 and 114 can be aligned with corresponding openings of the device enclosure (not shown). Subsequently, fasteners can be driven through openings 112 and 114 and into the corresponding openings of the device enclosure until bracket 108 is securely fastened to an inside surface of the device enclosure. In some embodiments, the fastener passing through opening 112 can also be utilized to further secure securing element 106 to bracket 108 by passing that fastener through opening 124. Accordingly, securing element 106 would also be secured with the device enclosure. To further secure bracket 108 to the device enclosure, hook 120 can be used to hook bracket 108 onto a portion of the device enclosure.

Securing element 106 can include alignment feature 122 and opening 124. In one embodiment, alignment feature 122 can be located along a periphery of securing element 106. In another embodiment, alignment feature 122 can be located at a central portion of securing element 106. Alignment feature 122 is a feature that can be sized and dimensioned to work in conjunction with alignment feature 110 to correctly align securing element 106 and bracket 108 when assembled. For example, alignment feature 122 can be a portion of securing element 106 that is arched. Accordingly, alignment feature 110 can be dimensioned and sized to have an arched portion that compliments alignment feature 122. The alignment system of 122 and 110 assists in the assembly procedure by aligning securing element 106 and bracket 108 correctly before they are welded together at welding points 126. It should be noted that alignment feature 110 can be utilized in conjunction with an assembly fixture for positioning components of the securing system during various phases of assembly of the securing system.

Opening 124 can be dimensioned and shaped in accordance with opening 112 such that when securing element 106 and bracket 108 are attached, a fastening device such as a screw can pass through openings 124 and 112. Accordingly openings 124 and 112 can also be used as an alignment tool to confirm securing element 106 and bracket 108 are aligned correctly before and/or after securing element 106 and bracket 108 are welded together. For example, prior to attachment (e.g., welding operation), alignment can be verified by checking if openings 124 and 112 are aligned such that a fastener can pass through openings 124 and 112. It should be noted that in some embodiments, securing element 106 can be attached to bracket 108 without a fastener.

Planar portion 116 is a substantially planar portion of bracket 108. Accordingly it is suitable for receiving a substantially planar surface of stiffener 106. indentation 118 can be portions of bracket 108 that are not co-planar with respect to planar portion 116. indentation 118 can also be used to assist in aligning and securing elements to be coupled to bracket 108. For example, indentation 118 can be used to help align and hold bracket 108 and stiffener 106 into place (i.e., a desired alignment with respect to bracket 108 and stiffener 106) when they are welded together. For example, when aligning stiffener 106 and bracket 108, stiffener 106 can be placed adjacent to planar portion 116 and orientated such that openings 112 and 124 are aligned and alignment features 110 and 122 are aligned. During the welding operation, stiffener 106 can be biased toward indentation 118. Because a portion of indentation 118 is taller/thicker than stiffener 106, indentation 118 (in conjunction with alignment features 110 and 122) can prevent stiffener 106 from moving in one or more directions when welded. indentation 118 can also establish another surface area for receiving other components or devices. For example, indentation 118 can have a surface area suitable for supporting another flexible circuit or another securing element.

Figure 3:
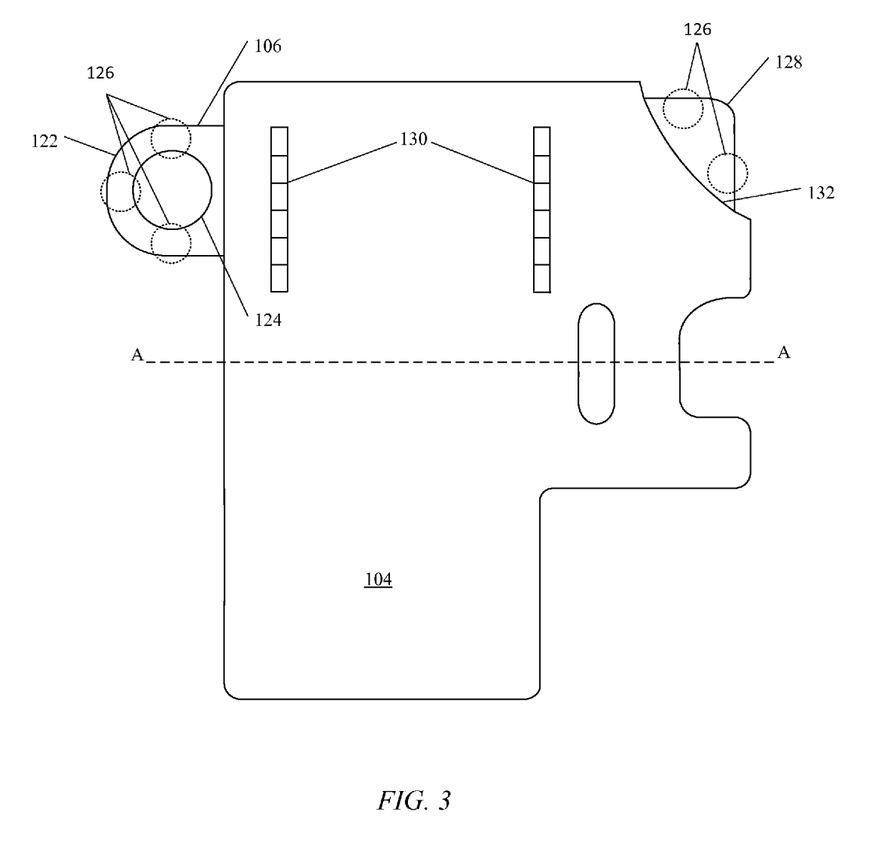
FIG. 3 shows a flexible circuit attached to a stiffener.

FIG. 3 shows securing element 106 coupled to one side of flexible circuit 104 in accordance to one embodiment. In one aspect of the embodiment, securing element 106 can be coupled to flexible circuit 104 with a heat-activated adhesive. The heat-activated adhesive can be a film applied between securing element 106 and flexible circuit 104. For example, a heat-activated adhesive could be a heat sensitive epoxy having a thickness of about 0.02 mm. Any number of processes can be used to couple securing element 106 and flexible circuit 104 with the heat-activated adhesive including lamination, heated pressing, heat gun activation or an oven process. When coupled to flexible circuit 104, a portion of securing element 106 can protrude from the perimeter of flexible circuit 104. Portions of securing element 106 that protrude beyond the perimeter of flexible circuit 104 can be used as welding points 126 and visual cues in the alignment process. For example, alignment feature 122 protrudes from one end of flexible circuit 104. Alignment feature 122 can be used as one or more welding points 126 and as an alignment cue when aligning securing element 106 to bracket 108. Furthermore, when alignment feature 122 is used as one or more welding points, alignment feature 122 can be configured to be located to be a distance away from SMD 102 (and consequently away from solder pads 130) as to not reflow the solder and/or minimize the heat transferred to SMD 102 during the welding operation.

Flexible circuit 104 includes one or more solder pads 130 and cut portion 132. Solder pads 130 can be used to mount SMD 102 to a surface of flexible circuit 104. Cut portion 132 is a portion of flexible circuit 104 that is cut to uncover exposed portion 128 of securing element 106 for welding (i.e. cut portion 132 exposes one or more welding points 126). In one embodiment, cut portion 132 is a trimmed portion of flexible circuit's perimeter such that cut portion 132 is exposing one end of securing element 106. In another aspect of the embodiment, cut portion 132 can define an opening located within the body of flexible circuit 104 to expose a portion of securing element 106 remote from flexible circuit's perimeter.

Figure 4:
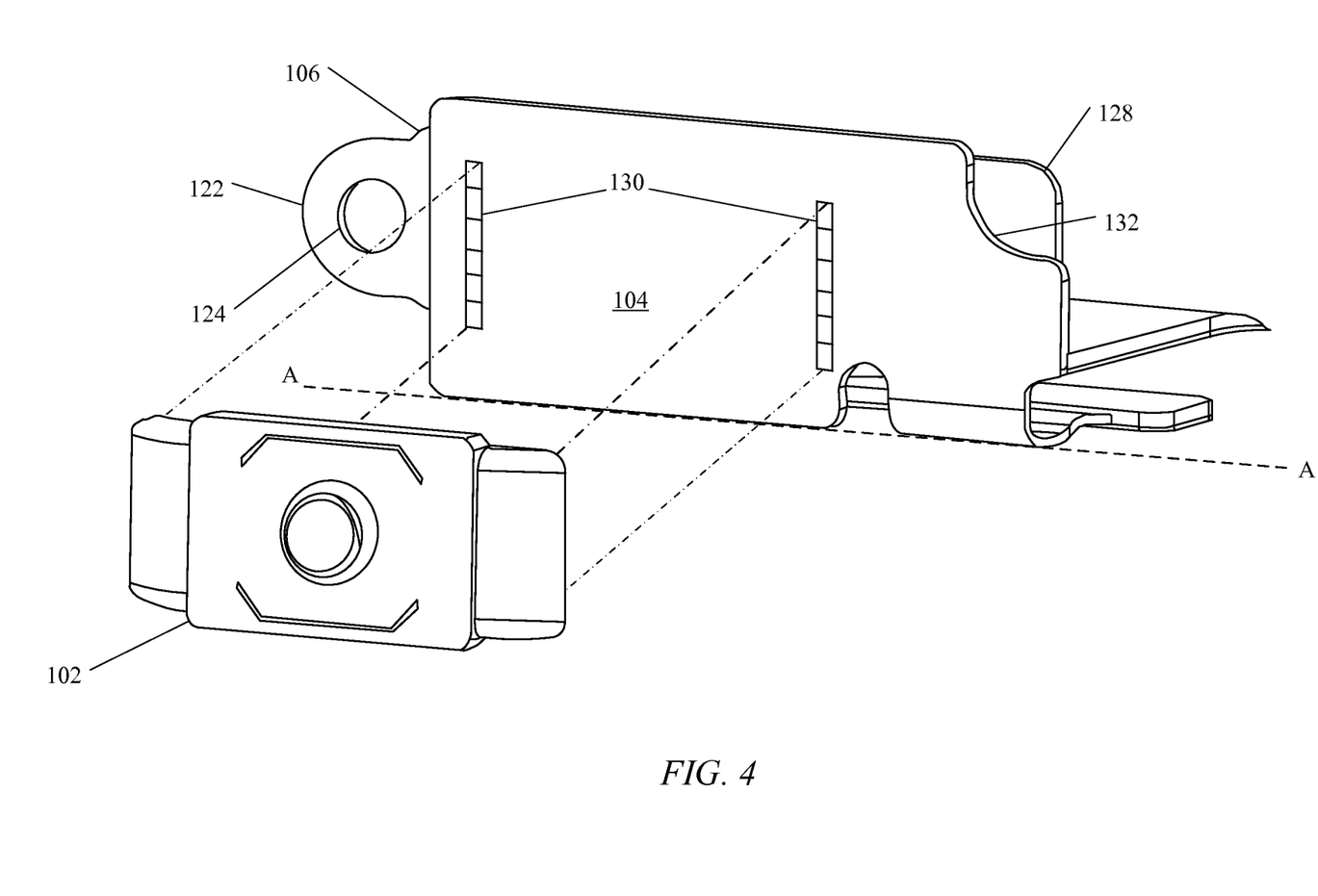
FIG. 4 shows a folded flexible circuit attached to a stiffener and a surface-mount device.

FIG. 4 shows a perspective view of securing element 106 coupled to one side of flexible circuit 104 in accordance with one embodiment. Because the flexible circuit 104 can operate in a bendable and flexed position, flexible circuit 104 can be folded at line A, allowing a first portion of flexible circuit 104 to extend in a different direction relative to a second portion that is attached to securing element 106. In one embodiment, the first and second portions of flexible circuit 104 relative to line A are substantially orthogonal, allowing the first portion to extend to a portion of the electronic device remote from securing element 106. Accordingly, the first portion can be used to provide functionality at other portions of the electronic device and/or electrically couple SMD 102 with components remote from SMD 102. For example, the first portion can extend to and electrically couple with a processor that is remote from SMD 102. A conductive trace within flexible circuit 104 can be configured to electrically couple SMD 102 with the processor.

Solder pads 130 are configured to compliment the leads of SMD 102 such that SMD 102 can be mounted to flexible circuit 104 using surface-mounting techniques. In one embodiment, SMD 102 is mounted on flexible circuit 104 directly opposite of securing element 106. In this case, securing element 106 can provide SMD 102 with structural support. In another embodiment, SMD 102 can be electrically coupled to a ground reference using any combination of the intermediate elements (flexible circuit 104, securing element 106, and bracket 108) between SMD 102 and the ground reference. For example, typically a device enclosure made of metal can be used as a chassis ground. SMD 102 is electrically coupled to flexible circuit 104 via solder pads 130. Flexible circuit 104 can be conductively laminated to securing element 106 such that a signal or electrically conductive grounding path can be established between flexible circuit 104 and securing element 106. For example, the heat-activated adhesive can include conductive particles allowing electrical signals to pass between the bonded components. Furthermore, securing element 106 can be conductively welded to bracket 108 or conductively connected with bracket 108 via a fastener threaded through openings 124 and 112. In turn bracket 108 can be conductively fastened to the device enclosure. Accordingly, flexible circuit 104, securing element 106 and bracket 108 can be configured to provide SMD 102 an electrically conductive grounding path to chassis ground (e.g. the device enclosure).

Figure 5:
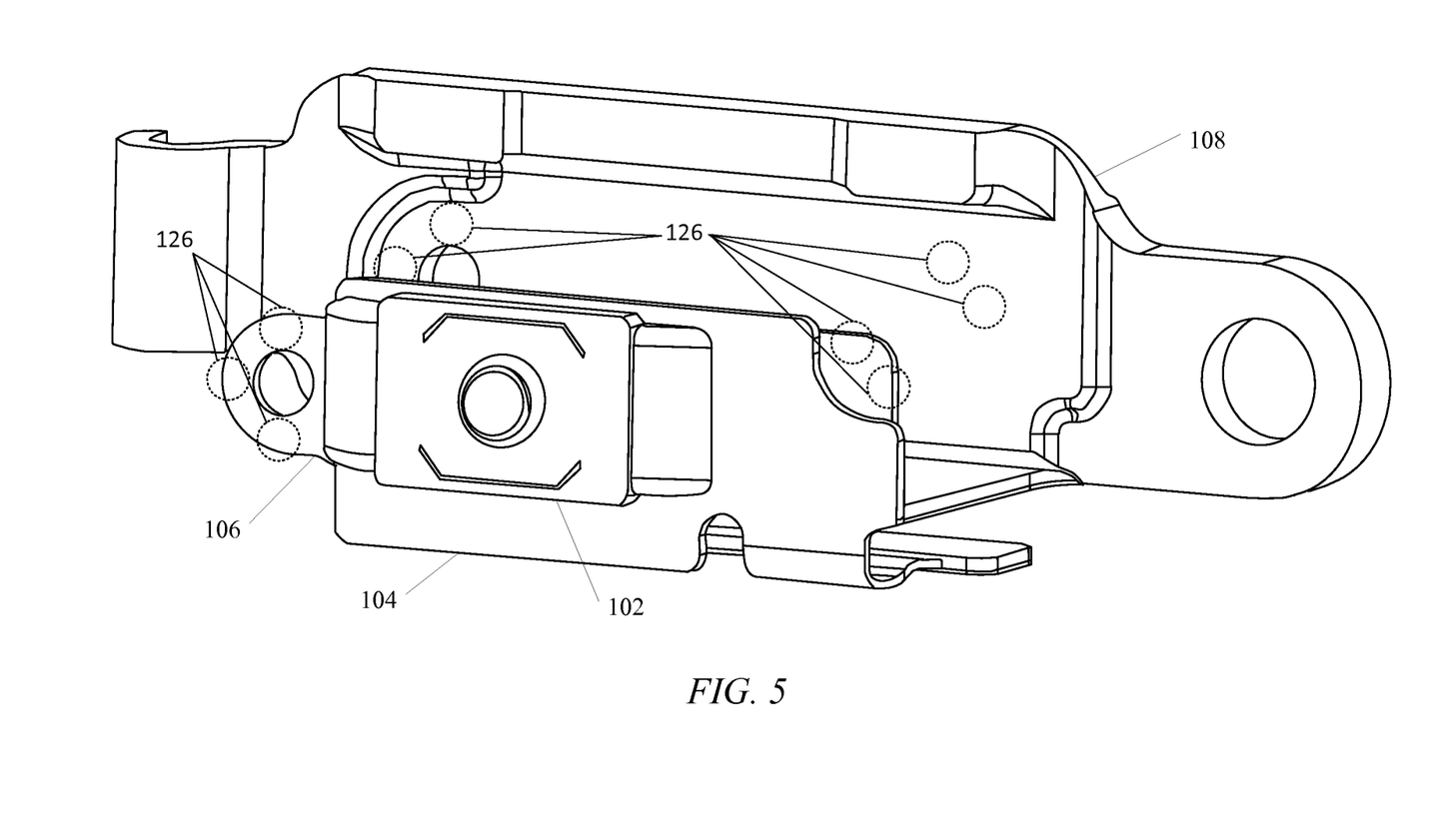
FIG. 5 shows a folded flexible circuit, a stiffener, and a surface-mount device attached and a bracket.
Figure 6:
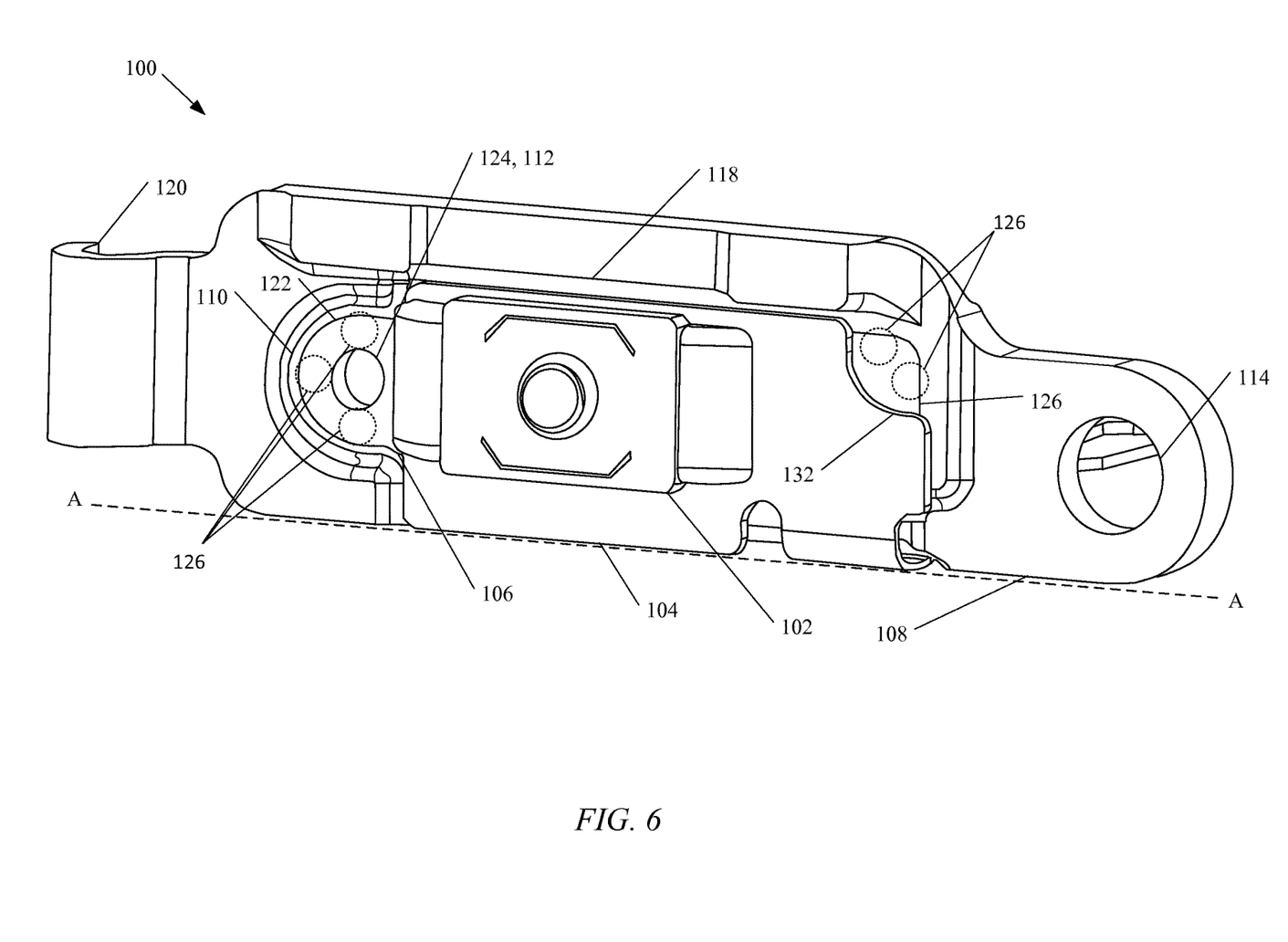
FIG. 6 shows a perspective view of the securing system of FIG. 1 when all components are attached.

FIG. 5 shows a perspective view of securing system 100 where SMD 102, flexible circuit 104, and securing element 106 are coupled and ready to be coupled to bracket 108 in accordance to one embodiment. Securing element 106 can be welded to bracket 108 at welding points 126. The welding operation is selected in order to minimize the heat transferred to other elements (e.g., flexible circuit 104, SMD 102), as to prevent decoupling between other elements and/or prevent damage to the elements. In one aspect of the embodiment, securing element 106 and bracket 108 are welded together during a laser beam welding operation, such that a highly concentrated, limited amount of heat is applied during the operation. Furthermore, because the heat required in a welding operation can be proportional to the thickness of the objects welded, if the securing element 106 is thin (relative to bracket 108), the welding operation can be performed using heat sufficiently low as to not damage flexible circuit 104/SMD 102 or reflow the solder used to mount SMD 102. In addition, welding points 126 can be selected to be at portions of securing element 106 that are away from the perimeter of flexible circuit 104 such that welding points 126 are relatively remote from the main body of flexible circuit 104 and SMD 102. In this way, heat generated by the welding operation can be substantially dissipated across bracket 108 and securing element 106 before coming into contact with the solder used to mount SMD 102. Consequently, the energy delivered from the welding operation can be minimal enough that the solder does not undergo reflow. FIG. 6 shows a fully assembled securing system 100 including SMD 102, flexible circuit 104, and securing element 106 all securely coupled with bracket 108. In one embodiment, flexible circuit 104 is bent at line A, where line A corresponds to an edge of bracket 108. Accordingly, a portion of flexible circuit 104 can be bent to be substantially orthogonal to a surface of bracket 108. As assembled, securing system 100 can then be fastened to a device enclosure using openings 124, 112 and 114 and/or hook 120. Accordingly, securing system 100 secures SMD 102 within the device enclosure.

Figure 7:
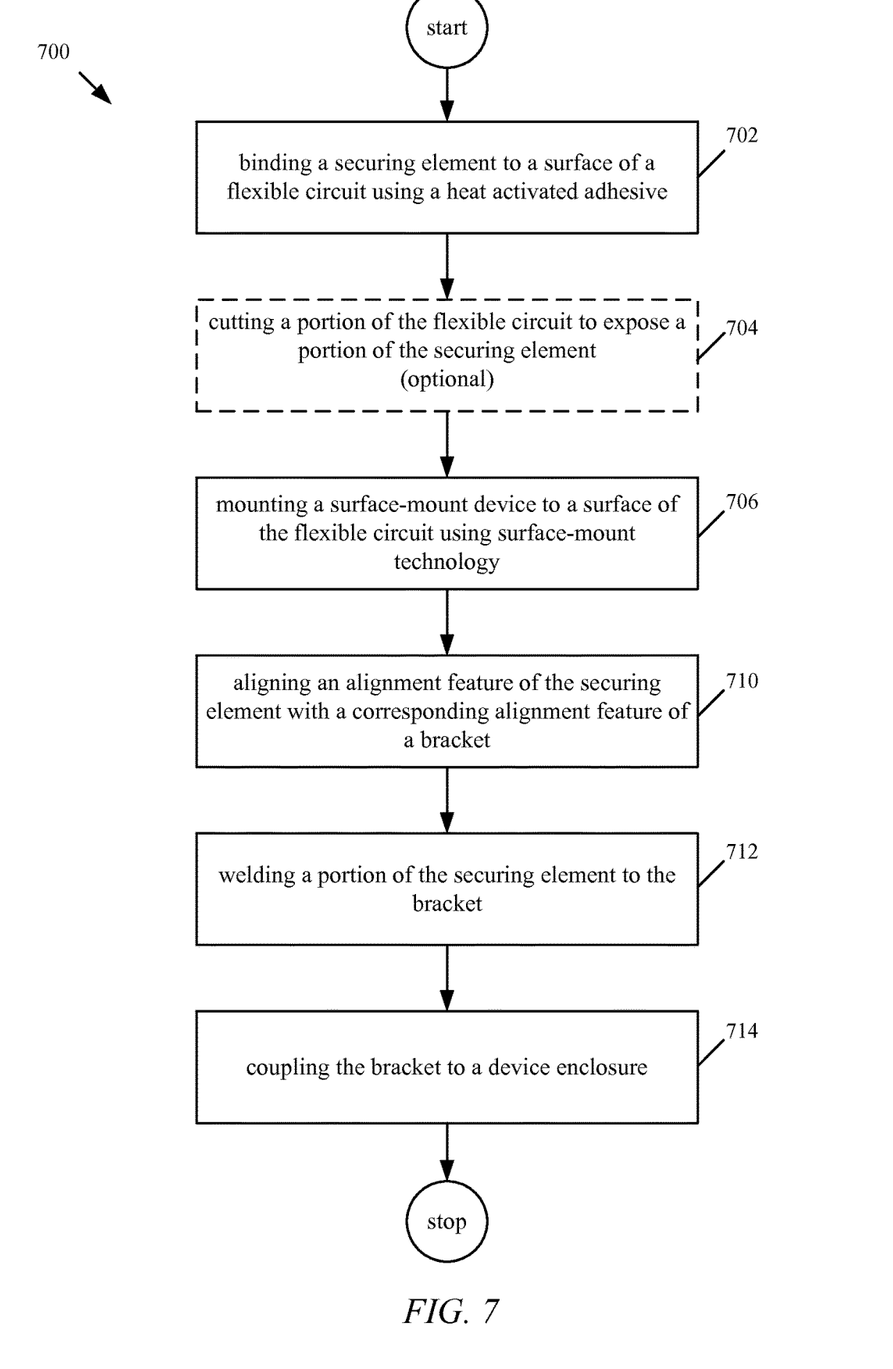
FIG. 7 shows a flowchart detailing a process in accordance with the described embodiments.

FIG. 7 is a flow chart detailing a process 700 for securing a flexible circuit to a bracket according to one embodiment. Process 700 beings at 702, where a portion of the securing element is bound to a surface of a flexible circuit using a heat-activated adhesive. In one aspect of the embodiment, the heat-activated adhesive is an epoxy. Optionally at 704, a portion of the flexible circuit is contoured to expose a portion of the securing element. Alternatively, 704 can be performed before the securing element is bound to the flexible circuit. Next at 706 an SMD is mounted to a surface of the flexible circuit using surface-mounting techniques. For example, a reflow solder process or wave soldering process can be used to mount the SMD. At 710, alignment features on the securing element and are aligned with corresponding alignment features on the bracket. Next, a portion of the securing element is welded to the bracket at 712. Any number of welding techniques can be used including laser welding, resistance welding and ultrasonic welding. In one aspect of the embodiment, securing element is welded to the bracket at the portions of the securing element exposed in 704. At 714, the bracket can be coupled to a device enclosure. In some embodiments, the bracket is coupled to the device enclosure by driving one or more fasteners through corresponding openings of the bracket and the device enclosure. In other embodiments, the bracket is coupled to the device enclosure by hooking a portion the device enclosure with a hook of the bracket. Accordingly, at the end of the process 700 the flexible circuit and SMD is securely coupled with the device enclosure.

The various aspects, embodiments, implementations or features of the described embodiments can be used separately or in any combination. Various aspects of the described embodiments can be implemented by software, hardware or a combination of hardware and software. The described embodiments can also be embodied as computer readable code on a computer readable medium for controlling manufacturing operations or as computer readable code on a computer readable medium for controlling a manufacturing line. The computer readable medium is any data storage device that can store data which can thereafter be read by a computer system. Examples of the computer readable medium include read-only memory, random-access memory, CD-ROMs, HDDs, DVDs, magnetic tape, and optical data storage devices. The computer readable medium can also be distributed over network-coupled computer systems so that the computer readable code is stored and executed in a distributed fashion.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of specific embodiments are presented for purposes of illustration and description. They are not intended to be exhaustive or to limit the described embodiments to the precise forms disclosed. It will be apparent to one of ordinary skill in the art that many modifications and variations are possible in view of the above teachings.

What is claimed is:

1. A securing assembly suitable for securing a component to a mounting surface of an enclosure of an electronic device, the securing assembly comprising:
   a flexible circuit having a first surface and a second surface, the first surface opposite the second surface;
   a surface-mount device electrically coupled with the flexible circuit at the first surface;
   a securing element coupled with the flexible circuit at the second surface, the securing element comprising a securing element hole and a first welding point, the securing element further comprising a first end having a first curved perimeter and a second end opposite the first end, the second end having a second curved perimeter different than the first curved perimeter;
   a bracket comprising an indentation into the bracket, the indentation having a first section having a first shape corresponding to the first curved perimeter, the indentation further having a second section having a second shape corresponding to the second curved perimeter such that the bracket receives the securing element at the indentation, the bracket further comprising a bracket hole aligned with the securing element hole such that the bracket hole and the securing element hole; and
   a fastener that passes through the bracket hole and the securing element hole and secures the surface-mount device with the mounting surface, wherein the indentation comprises a second welding point aligned with the first welding to join the securing element with the bracket by a weld.

2. The securing assembly as recited in claim 1, wherein the indentation comprises a rounded feature that aligns a corresponding rounded feature of the securing element with respect to the bracket.

3. The securing assembly as recited in claim 1, wherein the bracket is separate from the enclosure.

4. The securing assembly of claim 1, wherein the flexible circuit defines an outer perimeter on the securing element when the flexible circuit is coupled to the securing element, and wherein the first welding point is external with respect to the outer perimeter.

5. The securing assembly as recited in claim 1, further comprising a third welding point located on the securing element that aligns with a fourth welding point on the bracket, wherein the flexible circuit comprises a contoured region to expose the third welding point.

6. The securing assembly as recited in claim 5, wherein the third welding point is secured with the fourth welding point by a weld.

7. The securing assembly as recited in claim 6, wherein the flexible circuit defines an outer perimeter when positioned on the securing element, wherein the securing element hole, the first welding point, the second welding point, the third welding point, and the fourth welding point are disposed in a location external with respect to the outer perimeter.

8. The securing assembly as recited in claim 7, wherein the outer perimeter defines the contoured region, and wherein the third welding point and the fourth welding point are in a location corresponding to the contoured region.

9. The securing assembly as recited in claim 1, wherein the bracket hole comprises a through hole disposed in the recessed portion.

10. An electronic device, comprising:
    an enclosure having an inside surface;
    a securing assembly carried by the enclosure and coupled with the inside surface, the securing assembly comprising:
       a flexible circuit having a first surface and a second surface opposite the second surface,
       a surface-mount device electrically coupled with the flexible circuit at the first surface,
       a securing element coupled with the flexible circuit at the second surface, and the securing element comprises a first end having a rounded perimeter and a second end opposite the first end, the second end having a linear perimeter, and
       a bracket separate from the enclosure and aligned with the second surface, the bracket comprising an indentation in the bracket, the indentation having a size and a shape in accordance with that of the securing element such that the securing element is positioned in the bracket at the indentation and enclosed between the bracket and the flexible circuit, the indentation includes a first section having a first shape corresponding to the having a rounded perimeter, the indentation further having a second section having a second shape corresponding to the linear perimeter such that the bracket receives the securing element at the indentation, wherein the indentation comprises bracket welding points that surround a bracket opening, and wherein the securing element comprises securing element welding points aligned with the bracket welding points and surrounding a securing element opening.

11. The electronic device as recited in claim 10, wherein the bracket is removably coupled with the enclosure by a hook.

12. The electronic device as recited in claim 10, wherein:
    the bracket comprises a bracket hole,
    the securing element comprises a securing element hole, and
    the inside surface comprises a surface hole aligned with the bracket hole and the securing element hole to allow a fastener to pass through the bracket hole, the securing element hole, and the surface hole.

13. The electronic device as recited in claim 10, wherein the securing element is secured with the bracket by a first weld at a first welding location and by a second well at a second welding location opposite the first welding location, and wherein the first welding location and the second welding location are external with respect to a location on the securing element occupied by the second surface of the flexible circuit.

14. The electronic device as recited in claim 13, wherein:
the securing element comprises a securing element opening,
the bracket comprises a first bracket opening aligned with the securing element opening and between the first welding location and the second welding location, and
the bracket comprises a second bracket opening external with respect to the first welding location and the second welding location.

15. The electronic device as recited in claim 13, wherein the bracket comprises a hook that combines with the second bracket opening to the bracket with the inside surface.

16. The electronic device as recited in claim 10, wherein the bracket welding points are welded with the securing element welding points to secure the bracket with the securing element.

* * * * *